(12) United States Patent
Chiu

(10) Patent No.: US 7,564,309 B2
(45) Date of Patent: Jul. 21, 2009

(54) WIDE INPUT COMMON MODE FOR INPUT BIAS CURRENT CANCELLATION

(75) Inventor: Kwok-Fu Chiu, San Jose, CA (US)

(73) Assignee: National Semiconductor Corportaion, Santa Clara, CA (US)

( * ) Notice: Subject to any disclaimer, the term of this patent is extended or adjusted under 35 U.S.C. 154(b) by 125 days.

(21) Appl. No.: 11/636,348

(22) Filed: Dec. 6, 2006

(65) Prior Publication Data
US 2008/0068085 A1    Mar. 20, 2008

Related U.S. Application Data

(60) Provisional application No. 60/841,889, filed on Aug. 31, 2006.

(51) Int. Cl.
*H03F 3/45* (2006.01)
(52) U.S. Cl. .................................... 330/261; 330/257
(58) Field of Classification Search ................. 330/257, 330/261
See application file for complete search history.

(56) References Cited

U.S. PATENT DOCUMENTS

| | | | |
|---|---|---|---|
| 4,471,321 A * | 9/1984 | Bowers ..................... 330/261 |
| 4,755,770 A | 7/1988 | Groom | |
| 4,843,342 A | 6/1989 | Hester et al. ............... 330/257 |
| 4,855,684 A * | 8/1989 | Gerstenhaber et al. ...... 330/257 |
| 5,128,564 A | 7/1992 | Harvey et al. ............... 307/494 |
| 5,471,174 A | 11/1995 | Petty | |
| 5,764,464 A | 6/1998 | Botker et al. .................. 361/56 |
| 6,575,685 B2 | 6/2003 | Baxter, Sr. ..................... 414/10 |
| 6,636,111 B1 * | 10/2003 | Gross et al. ................. 327/589 |
| 6,965,267 B2 * | 11/2005 | Delorme et al. ............. 330/257 |
| 7,068,106 B2 * | 6/2006 | Harvey ........................ 330/261 |
| 7,145,391 B2 * | 12/2006 | Harvey ........................ 330/261 |
| 2006/0061420 A1 | 3/2006 | Harvey | |

OTHER PUBLICATIONS

Amplifier Techniques for Combining Low Noise, Precision, and High-Speed Performance Erdi, G. IEEE Journal of Solid-State Circuits, vol. 16, Issue 6, Dec. 1981 pp. 653-661.
"Op Amp Combining Precision, High sSpeed and High Output Current Drive for +-5-V Power Supply Operation" Ngo, T. Hester, R. IEEE Journal of Solid-State Circuits, vol. 25, Issue 3, Jun. 1990 pp. 856-862.
"A 0.01% Linear Instrumentation Amplifier" Nelson, C. Solid-State Circuits Conference, Digest of Technical Papers, 1980 IEEE International vol. XXIII, Feb. 1980 pp. 134-135.
"LT1678/LT1679 Dual/Quad Low Noise, Rail-To-Rail, Precision Op Amps, Product Datasheet" Linear Technology Corporation 2003.

* cited by examiner

*Primary Examiner*—Khanh V Nguyen

(57) ABSTRACT

Described herein is technology for, among other things, input bias current cancellation. The technology includes a bipolar differential pair coupled with a supply voltage ($V_{CC}$). The bipolar differential pair includes a first transistor and a second transistor. The technology further includes an input bias current cancellation circuit coupled with the bipolar differential pair and including a third transistor. The third transistor has a collector-emitter voltage $V_{CE}$, and the bipolar differential pair is operable to receive an input voltage greater than $V_{CC}-2V_{CE}$ without causing the third transistor to operate in the saturation region.

20 Claims, 6 Drawing Sheets

WIDE INPUT COMMON MODE FOR INPUT BIAS CURRENT CANCELLATION

CLAIM OF PRIORITY UNDER 35 U.S.C. §119

The present Application for Patent claims priority to Provisional Application No. 60/841,889 entitled "WIDE INPUT COMMON MODE FOR INPUT BIAS CURRENT CANCELLATION" filed Aug. 31, 2006, and assigned to the assignee hereof and hereby expressly incorporated by reference herein.

BACKGROUND

1. Field

Embodiments of the present invention generally relate to the field of operational amplifiers.

2. Background

The use of bipolar transistors in amplifiers has many managers over CMOS, such as large gain, better matching, and better noise performance. However, the finite input impedance of BJT amplifiers caused by the existence of these currents can be a major limitation.

To reduce the input bias current for a bipolar differential pair, the concept of input bias current cancellation has been developed. Generally, input bias current cancellation involves supplying the same amount of bias current into the input internally. However, conventional methods of input bias current cancellation require large voltage headroom for the circuit to work properly (up to 2 V in some cases). Today's low-voltage applications do not have the luxury of such a generous voltage headroom.

More recent efforts have been made to reduce the voltage headroom required by input bias current cancellation circuits. For example, FIG. 1 illustrates the LT1678/LT1769 Op-Amp 100 manufactured by Linear Technology, Inc. In op-amp 100, in order to prevent input transistors Q1 and Q2 from going into saturation, the input voltage must not exceed the supply voltage ($+V_S$ in FIG. 1) minus the collector-emitter voltages of Q4 and Q5/Q6. In other words, op-amp 100 has a voltage overhead of $2V_{CE}(sat)$. However, this voltage overhead is still unacceptable for lower voltage applications such as those using a 2 V power supply. Furthermore, a mismatch of $V_{CE}$ for Q4 and Q7 and the base current of the associated current mirror would cause a large amount of additional error. In some cases, applications require voltage headroom as low as 0.1 V.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Described herein is technology for, among other things, input bias current cancellation. The technology includes a bipolar differential pair coupled with a supply voltage ($V_{CC}$). The bipolar differential pair includes a first transistor and a second transistor. The technology further includes an input bias current cancellation circuit coupled with the bipolar differential pair and including a third transistor. The third transistor has a collector-emitter voltage $V_{CE}$, and the bipolar differential pair is operable to receive an input voltage greater than $V_{CC}-2V_{CE}$ without causing the third transistor to operate in the saturation region.

Thus, embodiments provide for bias current cancellation and requires a significantly smaller voltage headroom than the 2VCE(sat) had required by op-amp 100 of FIG. 1. Some embodiments allow for a voltage headroom as low as one VCE(sat). This makes embodiments extremely beneficial in low-voltage applications, where voltage headroom is a precious commodity. Moreover, some embodiments are able to reduce error further by reducing Early effect. Thus, embodiments are able to achieve a maximum input voltage range while also minimizing error.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments of the present invention are directed to methods and circuits for canceling input bias current with a reduced voltage overhead. In some embodiments, a voltage overhead as low as 0.1 V or $1V_{CE}(sat)$ may be achieved.

Figure 1:
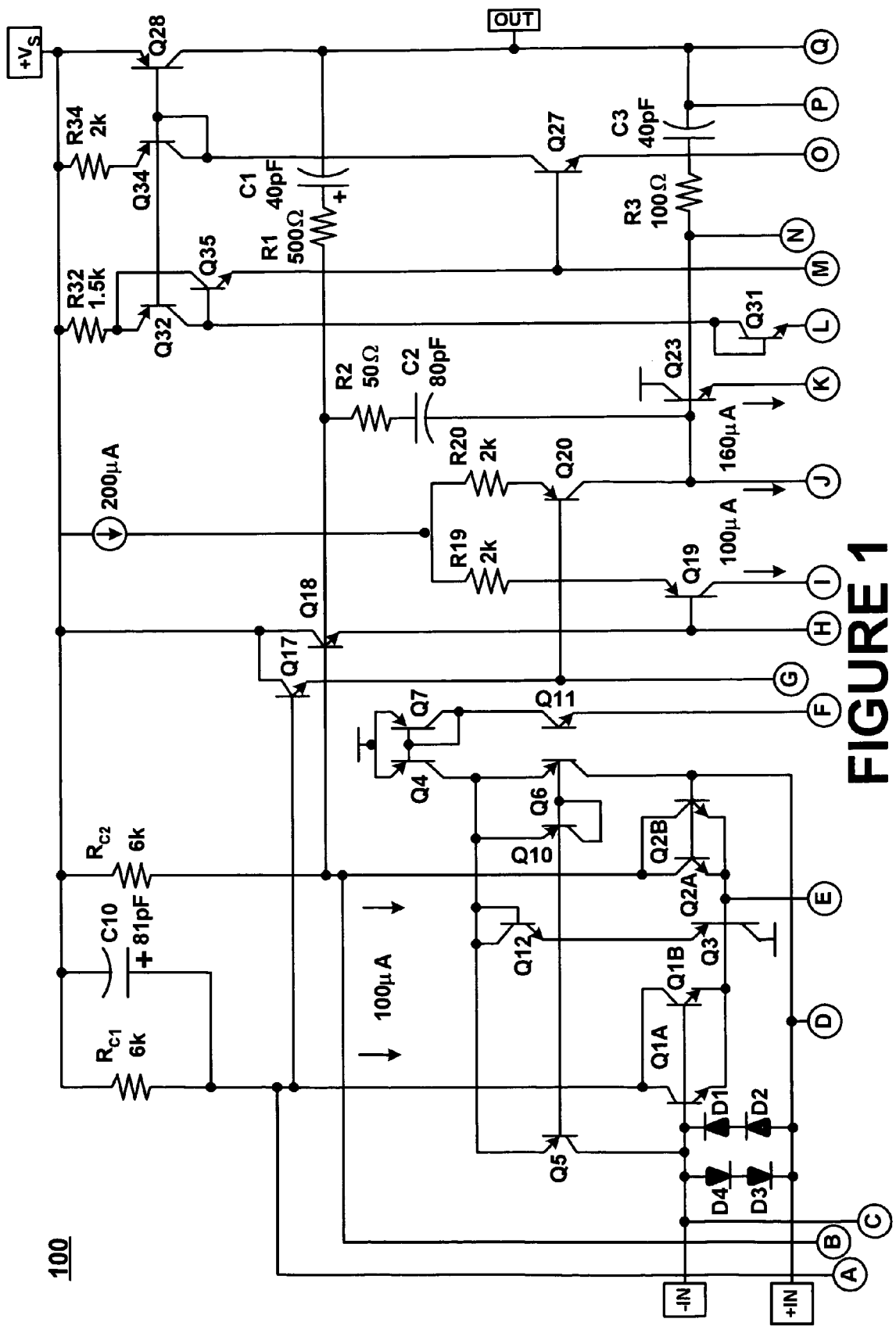
FIG. 1 illustrates a conventional op-amp employing input bias current cancellation.
Figure 1:
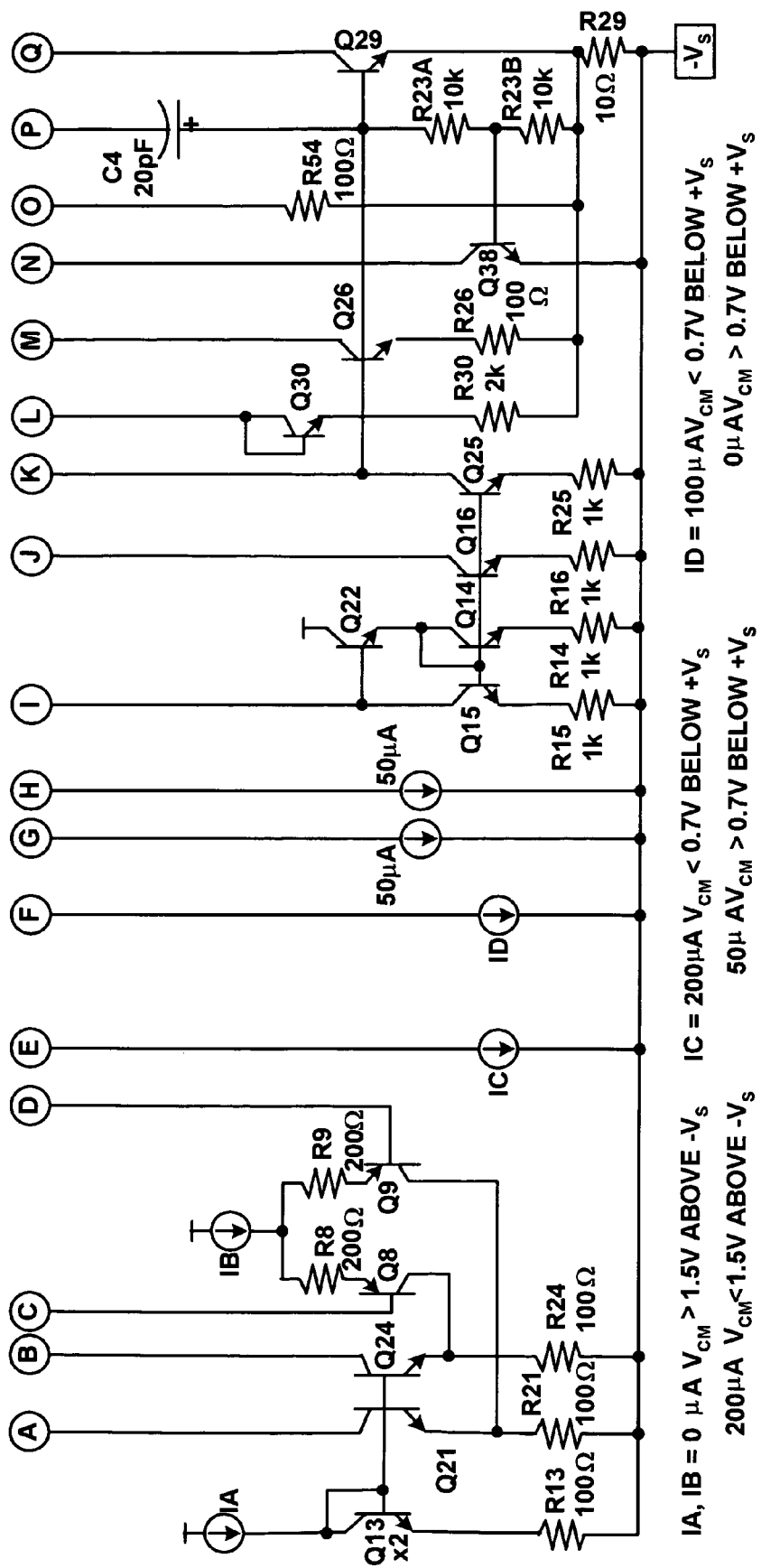
Figure 2:
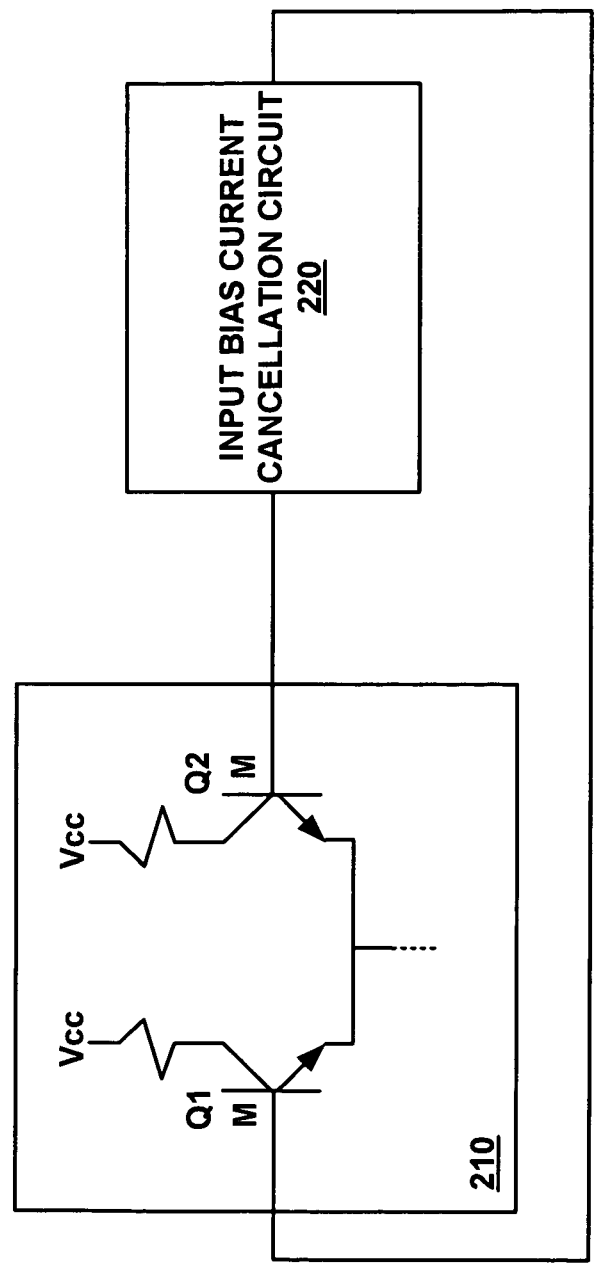
FIG. 2 illustrates a block diagram for a circuit employing input bias current cancellation, in accordance with various embodiments of the present invention.

FIG. 2 illustrates a block diagram for a circuit 200, in accordance with various embodiments of the present invention. Circuit 200 is well suited for use in an amplifier. However, it should be appreciated that circuit 200 may also be used in other applications such as . . . . Circuit 200 includes a bipolar differential pair 210 that comprises a first transistor Q1 and a second transistor Q2. Q1 and Q2 are coupled with the supply voltage $V_{CC}$ (via resistors). Circuit 200 also includes an input bias current cancellation circuit 220. In one embodiment, circuit 200 includes a third transistor (not shown) that has a collector-emitter voltage $V_{CE}$. Input bias current cancellation circuit 220 is designed such that the bipolar differential pair 210 is operable to receive input voltages up to $V_{CC}-V_{CE}$ without causing the third transistor to go into saturation. Thus, circuit 200 may continue to operate normally while receiving input voltages greater than $V_{CC}-2V_{CE}$, in contrast to op-amp 100 of FIG. 1, in which transistors Q4, Q5, and Q6 saturate for input voltages greater than $V_{CC}-2V_{CE}$.

Figure 3:
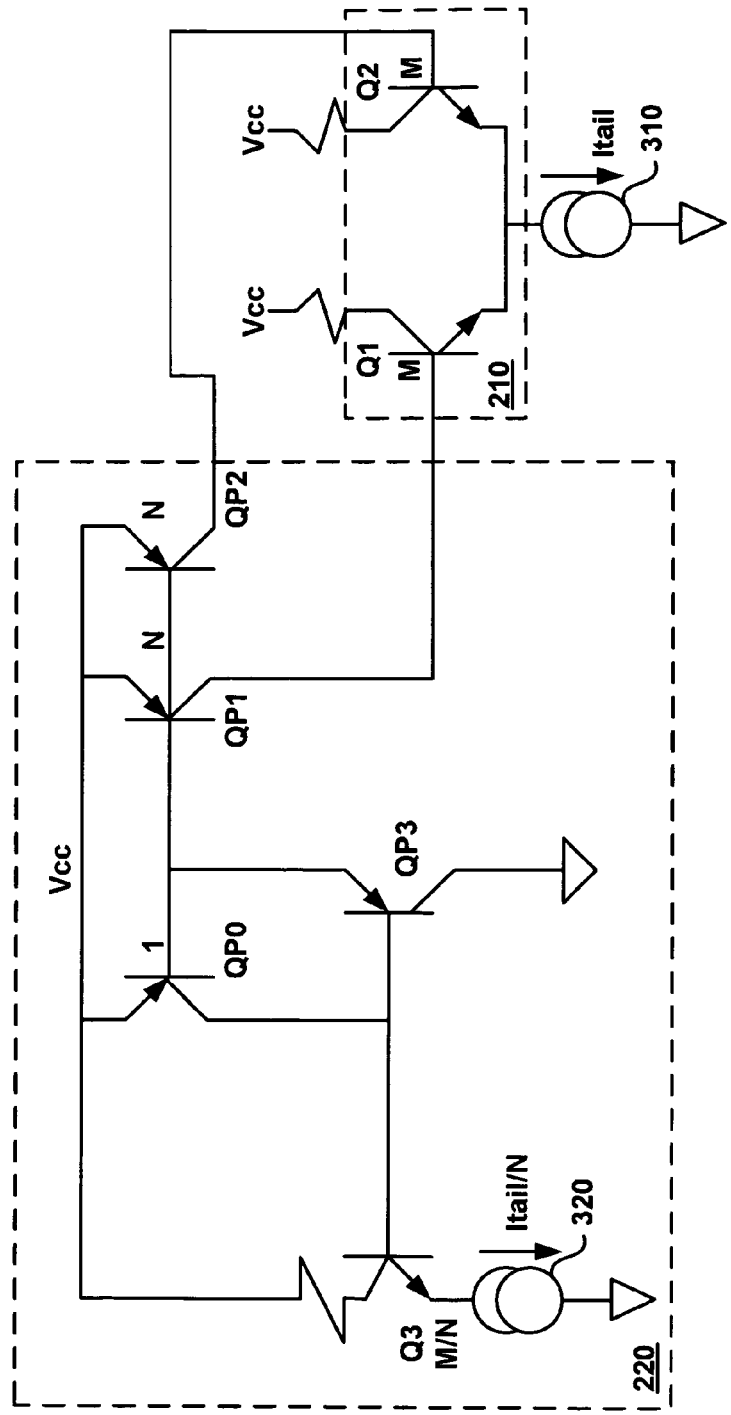
FIG. 3 illustrates a circuit for canceling input bias current for a bipolar differential pair, in accordance with various embodiments of the present invention.

FIG. 3 illustrates a circuit 300 for canceling input bias current for a bipolar differential pair 210, in accordance with various embodiments of the present invention. Bipolar differential pair 210 is driven by the current Itail, which is generated by current source 310. Current source 320 generates the current Itail/N, which is proportional to Itail by a factor of 1/N. Current source 320 drives the emitter current of transistor Q3. Since the emitter current of Q3 is proportional to the emitter currents of Q1 and Q2, its base current is also proportional to the base currents of Q1 and Q2.

The base current of Q3 and QP3 is sensed by a base current sensing circuit. In one embodiment, the base current sensing circuit comprises transistor QP0. The base current sensed by the base current sensing circuit (e.g., QP0) is then mirrored by a current mirror (e.g., transistors QP1 and a QP2). In doing so, QP1 mirrors the base current of Q3 for the base of Q1 and QP2 mirrors the base current of Q3 for the base of Q2. It should be appreciated that the current mirror transistors QP1 and QP2 must re-amplify the base current of Q3 by a factor of N.

Thus, the bias current cancellation circuit 220 applies substantially the same amount of current into the bases of the bipolar differential pair 210 that the pair's bases use. Circuit 300 requires only $1V_{CE}$ of voltage headroom to prevent the transistors QP1 and QP2 from going into saturation. For example, in order to prevent QP1 from going into saturation, an input voltage applied to the base of Q1 must not exceed the supply voltage (VCC) minus the collector-emitter voltage of QP1. Similarly, in order to prevent QP2 from going into saturation, an input voltage applied to the base of Q2 must not exceed VCC minus the collector-emitter voltage of QP2.

Figure 4:
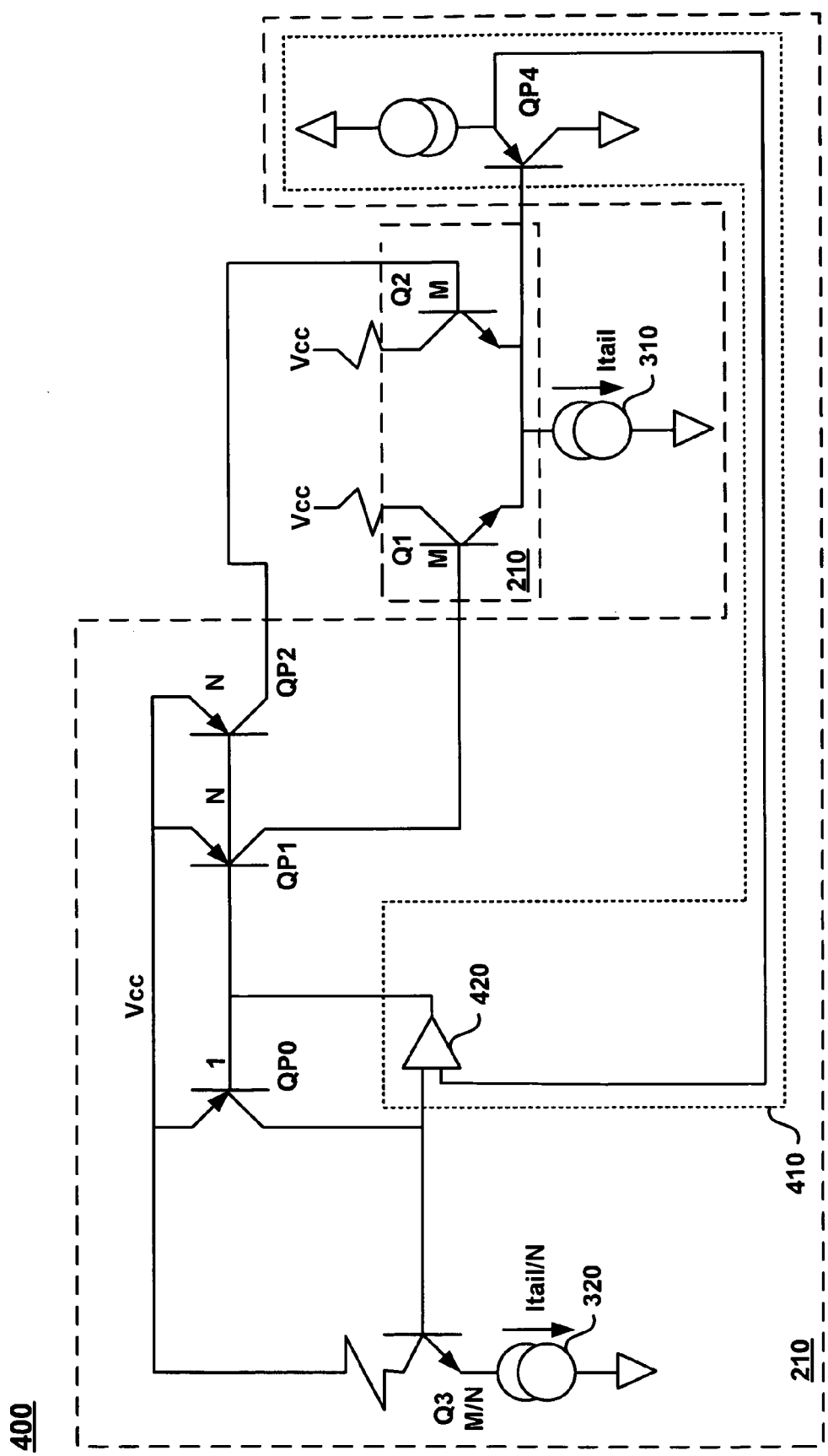
FIG. 4 illustrates a circuit for canceling input bias current that includes an Early effect cancellation circuit.

Circuit 300 may be modified to minimize potential Early effect. For example, FIG. 4 illustrates a circuit 400 for canceling input bias current that includes an Early effect cancellation circuit 410. The Early effect cancellation circuit 410 serves to maintain the collector of QP0 at substantially the same voltage as the collectors of QP1 and QP2. In one embodiment, Early effect cancellation circuit 410 is coupled with the bipolar differential pair 210 at transistor QP4. The collector of QP4 is at substantially the same voltage as the collectors of QP1 and QP2 because it is one base-emitter voltage above the emitters of Q1 and Q2, which are one base-emitter voltage below the collectors of QP1 and QP2. The collector of QP4 is coupled with one input of a voltage follower amplifier 420. The other input though the voltage follower amplifier 420 is coupled with the collector of QP0. Thus, the collector of QP0 is maintained at substantially the same voltage as the collectors of QP1 and QP2.

Figure 5:
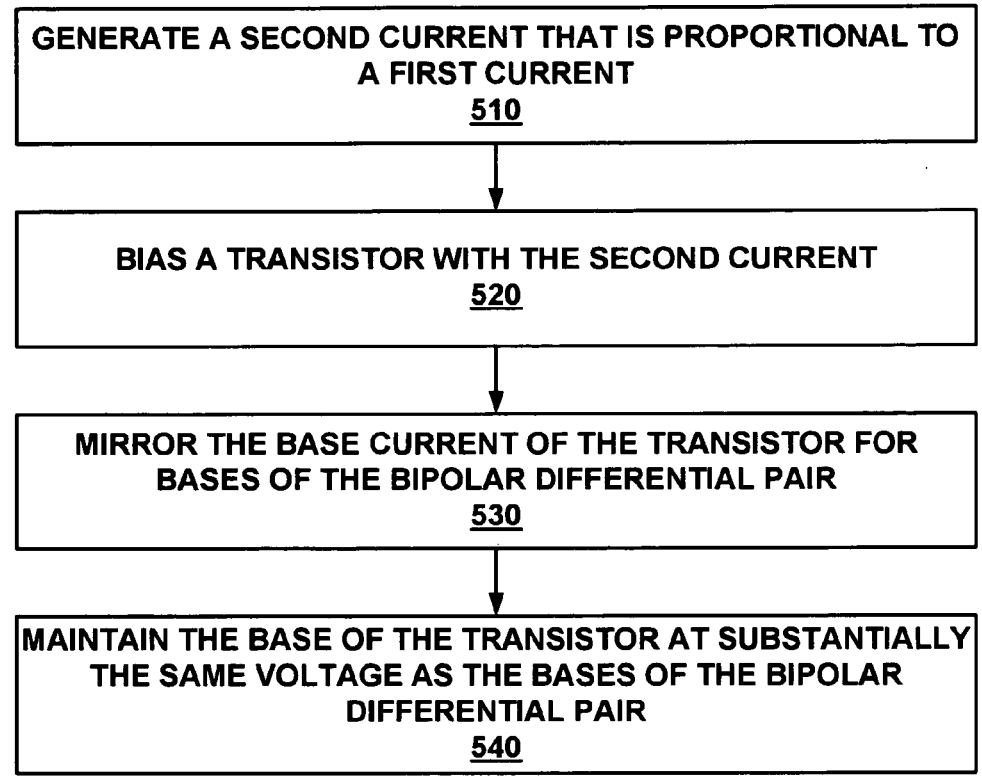
FIG. 5 illustrates a flowchart for bias current cancellation, in accordance with various embodiments of the present invention.

FIG. 5 illustrates a flowchart 500 for bias current cancellation, in accordance with various embodiments of the present invention. Flowchart 500 includes exemplary processes of various embodiments of the invention. Although specific operations are disclosed in flowchart 500, such operations are exemplary. Flowchart 500 may not include all of the operations illustrated by FIG. 5. Also, flowchart 500 may include various other operations and/or variations of the operations shown by FIG. 5. Likewise, the sequence of the operations of flowchart 500 can be modified.

Block 510 involves generating a second current and that is proportional to a first current, or in the first current drives a bipolar differential pair. Block 520 involves biasing a transistor with the second current. In one embodiment, the second current drives the emitter current of the transistor. Assuming the transistors operating in the active region, applying the second current to the emitter of the transistor generates a corresponding collector currents and base current for the transistor. Since the emitter current of the transistor is proportional to the emitter currents of the bipolar differential pair, to base current of the transistors also proportional to the base currents of the bipolar differential pair.

Block 530 involves mirroring the base current of the transistor for the bases of the bipolar differential pair. It should be appreciated that the current mirror may amplify the base current of the transistor to account for the proportion of the second current to the first current. Thus, by applying the same amount of current into the bases of the bipolar differential pair as is required in terms of their base current, any external input bias current scene at the inputs of the bipolar differential pair is effectively canceled (i.e., diverted away from the bipolar differential pair.

Block 540 involves maintaining the base of the transistor at substantially the same voltage as the bases of the bipolar differential pair. This serves to compensate for Early effect. In one embodiment, a second transistor (e.g., QP0) senses the base current of the first transistor (e.g., Q3). The base current of the first transistor (e.g., Q3) seen by the second transistor (e.g., QP0) may then be mirrored by a current mirror. In order to cancel the Early effect, the second transistor (e.g., QP0) should be biased to the same state as the current mirror. In one embodiment, this is achieved by maintaining the base of the first transistor (e.g., Q3), and thus the collector of the second transistor (e.g., QP0), at substantially the same voltage as the bases of the bipolar differential pair.

Thus, embodiments provide for bias current cancellation and requires a significantly smaller voltage headroom than the 2VCE(sat) had required by op-amp 100 of FIG. 1. Some embodiments allow for a voltage headroom as low as one VCE(sat). This makes embodiments extremely beneficial in low-voltage applications, where voltage headroom is a precious commodity. Moreover, some embodiments are able to reduce error further by reducing Early effect. Thus, embodiments are able to achieve a maximum input voltage range while also minimizing error.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit, comprising:

a bipolar differential pair coupled with a supply voltage ($V_{CC}$) and comprising a first transistor and a second transistor wherein collector currents of said first and second transistor are not required to be equal to collector currents of other transistors in said circuit; and an input bias current cancellation circuit coupled with said bipolar differential pair and comprising a third transistor, wherein said third transistor has a collector-emitter voltage $V_{CE}$, wherein further said bipolar differential pair is operable to receive an input voltage greater than $V_{CC}-2V_{CE}$ without causing said third transistor to operate in the saturation region, and wherein said input bias current cancellation circuit further comprises:

a current source for generating a first current that is proportional to a second current, wherein said second current drives said bipolar differential pair;

a fourth transistor coupled with said current source, wherein said current source drives said first transistor;

a base current sensing circuit coupled with said fourth transistor and for sensing a base current of said fourth transistor; and a current mirror coupled with said base current sensing circuit and said bipolar differential pair, said current mirror for mirroring said base current of said fourth transistor to bases of said bipolar differential pair.

2. The circuit as recited in claim 1 wherein said base current sensing circuit comprises a fifth transistor.

3. The circuit as recited in claim 1 wherein said current mirror comprises:

said third transistor coupled with said base current sensing circuit and operable to mirror said base current of said fourth transistor for one of said bipolar differential pair; and a fifth transistor coupled with said base current sensing circuit and operable to mirror said base current of said fourth transistor for the other of said bipolar differential pair.

4. The circuit as recited in claim 1 further comprising an Early effect cancellation circuit for maintaining said base current sensing circuit in the same state as said current mirror.

5. The circuit as recited in claim 4 wherein said Early effect cancellation circuit comprises a voltage follower circuit.

6. The circuit as recited in claim 4 wherein said Early effect cancellation circuit comprises:

a fifth transistor coupled with an emitter of said bipolar differential pair; and an amplifier coupled with said fourth transistor, said fifth transistor, said base current sensing circuit, and said current mirror, wherein said amplifier is operable to maintain said base of said fourth transistor at substantially the same voltage as an emitter of said fifth transistor.

7. A circuit, comprising:

a bipolar differential pair coupled with a supply voltage ($V_{CC}$) and comprising a first transistor and a second transistor wherein collector currents of said first and second transistor are not required to be equal to collector currents of other transistors in said circuit; and a input bias current cancellation circuit coupled with said bipolar differential pair and comprising a third transistor, wherein said third transistor has a collector-emitter voltage $V_{CE}$, wherein further said bipolar differential pair is operable to receive an input voltage up to $V_{CC}-V_{CE}$ without causing said third transistor to operate in the saturation region, and wherein said input bias current cancellation circuit comprises:

a current source for generating a first current that is proportional to a second current, wherein said second current drives said bipolar differential pair;

a fourth transistor coupled with said current source, wherein said current source drives said fourth transistor;

a base current sensing circuit coupled with said fourth transistor and for sensing a base current of said fourth transistor; and a current mirror coupled with said base current sensing circuit and said bipolar differential pair, said current mirror for mirroring said base current of said fourth transistor to bases of said bipolar differential pair.

8. The circuit as recited in claim 7 wherein said base current sensing circuit comprises a fifth transistor.

9. The circuit as recited in claim 7 wherein said current mirror comprises:

said third transistor coupled with said base current sensing circuit and operable to mirror said base current of said fourth transistor for one of said bipolar differential pair; and a fifth transistor coupled with said base current sensing circuit and operable to mirror said base current of said fourth transistor for the other of said bipolar differential pair.

10. The circuit as recited in claim 7 further comprising an Early effect cancellation circuit for maintaining said base current sensing circuit in the same state as said current mirror.

11. The circuit as recited in claim 10 wherein said Early effect cancellation circuit comprises a voltage follower circuit.

12. The circuit as recited in claim 10 wherein said Early effect cancellation circuit comprises:

a fifth transistor coupled with an emitter of said bipolar differential pair; and an amplifier coupled with said fourth transistor, said fifth transistor, said base current sensing circuit, and said current mirror wherein said amplifier is operable to maintain said base of said fourth transistor at substantially the same voltage as an emitter of said fifth transistor.

13. A circuit for canceling input bias current for a bipolar differential pair, wherein said bipolar differential pair is driven by a first current generated by a first current source, said circuit comprising:

a second current source for generating a second current that is proportional to said first current;

a first transistor coupled with said second current source, wherein said second current source drives said first transistor;

a base current sensing circuit coupled with said first transistor and for sensing a base current of said first transistor; and a current mirror coupled with said base current sensing circuit and said bipolar differential pair, said current mirror for mirroring said base current of said first transistor to bases of said bipolar differential pair, wherein said differential pair is operable to receive an input voltage greater than $V_{CC}-2V_{CE}$ without causing transistors of said current mirror to operate in their respective saturation regions and wherein collector currents of transistors of said bipolar differential pair are not required to be equal to collector currents of transistors that are a part of said circuit for canceling input bias.

14. The circuit as recited in claim 13 wherein said base current sensing circuit comprises a second transistor.

15. The circuit as recited in claim 13 wherein said current mirror comprises:

a second transistor coupled with said base current sensing circuit and is operable to mirror said base current of said first transistor for a first base of said bipolar differential pair; and a third transistor coupled with said base current sensing current and operable to mirror said base current of said first transistor for a second base of said bipolar differential pair.

16. The circuit as recited in claim 13 further comprising an Early effect cancellation circuit for maintaining said base of said first transistor at substantially the same voltage as the bases of said bipolar differential pair.

17. The circuit as recited in claim 16 wherein said Early effect cancellation circuit comprises a voltage follower circuit.

18. The circuit as recited in claim 16 wherein said Early effect cancellation circuit comprises:
   a second transistor coupled with an emitter of said bipolar differential pair; and
   an amplifier coupled with said first transistor, said second transistor, said base current sensing circuit, and said current mirror, wherein said amplifier is operable to maintain said base of said first transistor at substantially the same voltage as an emitter of said second transistor.

19. A method for canceling input bias current for a bipolar differential pair, comprising:
   generating a second current that is proportional to a first current, wherein said first current drives said bipolar differential pair;
   biasing a transistor with said second current; and
   mirroring a base current of said transistor for bases of said bipolar differential pair, wherein said bipolar differential pair is operable to receive an input voltage rater than $V_{CC}-2V_{CE}$ without causing at least one transistor used for the mirroring the base current of said transistor to operate in a saturation region and wherein collector currents of transistors of said bipolar differential pair are not required to be equal to collector currents of other transistors.

20. The method as recited in claim 19 further comprising:
   maintaining a base of said transistor at substantially the same voltage as the bases of said bipolar differential pair.

* * * * *